United States Patent [19]

Ishikawa et al.

[11] Patent Number: 5,594,358
[45] Date of Patent: Jan. 14, 1997

[54] RADIO FREQUENCY PROBE AND PROBE CARD INCLUDING A SIGNAL NEEDLE AND GROUNDING NEEDLE COUPLED TO A MICROSTRIP TRANSMISSION LINE

[75] Inventors: Osamu Ishikawa, Soraku-gun; Hiroyasu Takehara, Katano, both of Japan

[73] Assignee: Matsushita Electric Industrial Co., Ltd., Kadoma, Japan

[21] Appl. No.: 299,495

[22] Filed: Sep. 1, 1994

[30] Foreign Application Priority Data

Sep. 2, 1993 [JP] Japan ................................ 5-218332

[51] Int. Cl.⁶ ........................................... G01R 31/02
[52] U.S. Cl. ................................. 324/762; 324/754
[58] Field of Search .................................. 324/754, 750, 324/725, 762; 439/482; 333/246, 248

[56] References Cited

U.S. PATENT DOCUMENTS

| | | | |
|---|---|---|---|
| 3,849,728 | 11/1974 | Evans | 324/725 |
| 4,116,523 | 9/1978 | Coberly et al. | 324/754 |
| 4,593,243 | 6/1986 | Lao et al. | 324/754 |
| 4,686,463 | 8/1987 | Logan | 324/754 |
| 4,697,143 | 9/1987 | Lockwood et al. | 333/246 |
| 4,727,319 | 2/1988 | Shahriary | 324/754 |
| 4,749,942 | 6/1988 | Sang et al. | 324/754 |
| 4,791,363 | 12/1988 | Logan | 324/754 |
| 4,829,242 | 5/1989 | Carey et al. | 324/754 |
| 4,871,964 | 10/1989 | Boll et al. | 324/754 |

FOREIGN PATENT DOCUMENTS

| | | |
|---|---|---|
| 55-28025 | 7/1980 | Japan . |
| 227746 | 1/1990 | Japan . |

*Primary Examiner*—Vinh P. Nguyen
*Attorney, Agent, or Firm*—Renner, Otto, Boisselle, Sklar

[57] ABSTRACT

The radio frequency probe for measuring radio frequency characteristics of a semiconductor device includes: an insulating substrate having a front surface, a back surface, and a side bottom face; a microstrip transmission line including a signal line made of conductive material formed on the front surface of the insulating substrate and a grounding electrode made of conductive material formed on the substantially entire portion of the back surface of the insulating substrate; and a signal needle and a grounding needle electrically connected to the signal line and the grounding electrode, respectively, the signal needle and the grounding needle being close to each other and being disposed so that the distances from the side bottom face to the top ends of the needles are substantially equal to each other so as to allow the signal needle and the grounding needle to contact a signal electrode pad and a grounding electrode pad of the semiconductor device simultaneously. A probe card having the radio frequency probe is also provided.

4 Claims, 7 Drawing Sheets

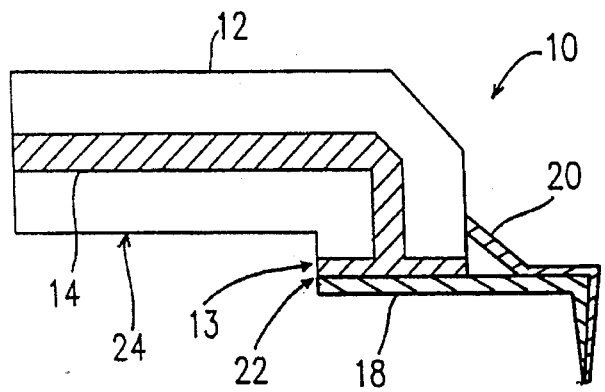
FIG. 1A
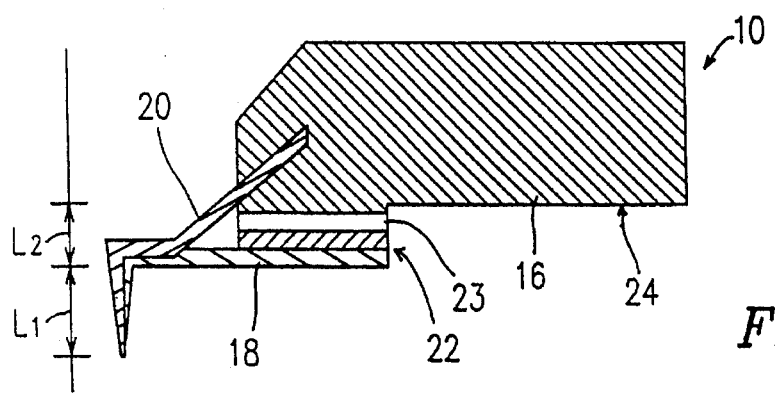
FIG. 1B
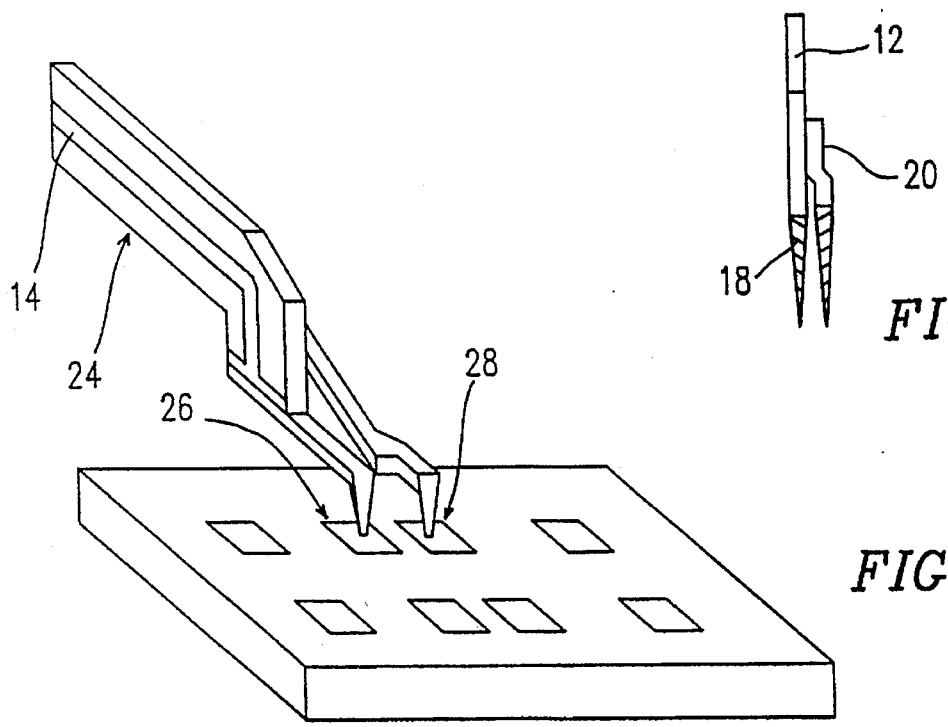
FIG. 1C
FIG. 1D

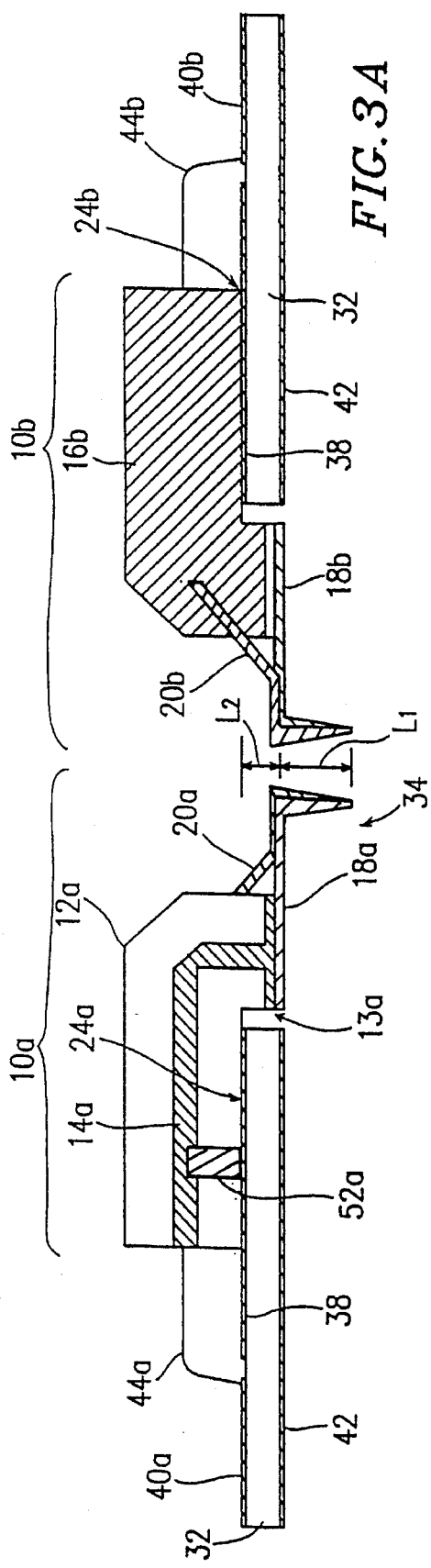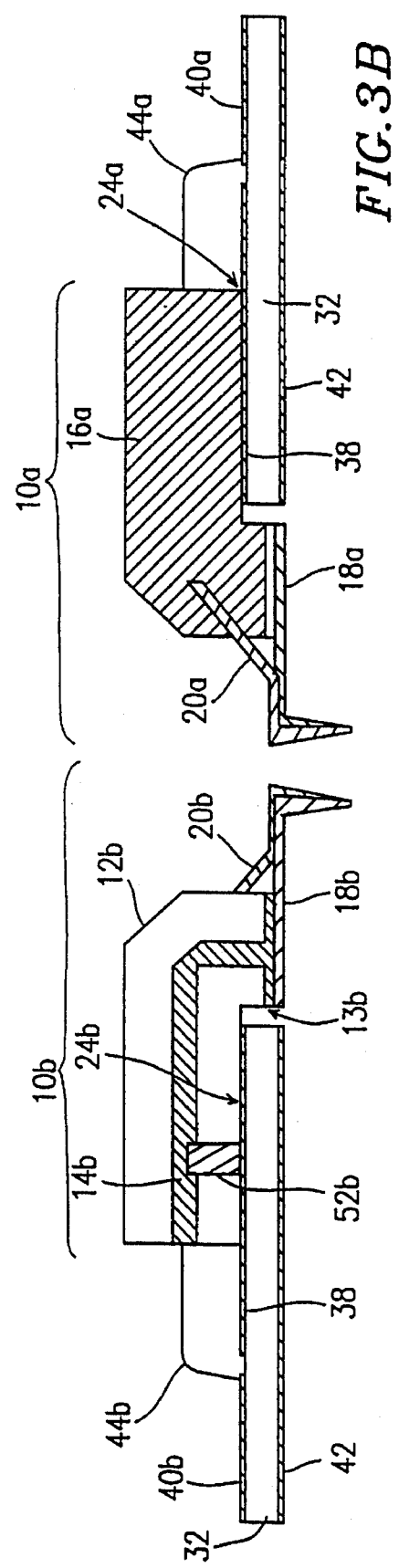

RADIO FREQUENCY PROBE AND PROBE CARD INCLUDING A SIGNAL NEEDLE AND GROUNDING NEEDLE COUPLED TO A MICROSTRIP TRANSMISSION LINE

BACKGROUND OF THE INVENTION

1. Field of the Invention

The present invention relates to a radio frequency (RF) probe for measuring the RF characteristics of a semiconductor device on a wafer, and a probe card including the radio frequency probe.

2. Description of the Related Art

In general, the RF characteristics of a semiconductor device is measured after the semiconductor device is assembled in a package of ceramic and the like. This is because, by providing lead terminals to the package, a packaged semiconductor device can be electrically connected to an outer circuit under predetermined conditions with good reproducibility, and thus the RF characteristics of the semiconductor device can be stably measured.

In recent years, for the realization of smaller-size apparatuses, chips of RF semiconductor devices are increasingly mounted directly onto a circuit board and the like without being packaged. The measurement of the RF characteristics of such semiconductor devices is therefore carried out in the form of chips. This measurement is made, for example, by a known method using a radio frequency probe, where a ceramic substrate on which a coplanar type RF transmission line is formed is brought into direct contact with a wafer, so as to measure S parameter of a semiconductor device. A radio frequency probe for digital signals is also known.

However, the coplanar type radio frequency probe is not only expensive, but also inferior in operational life as the top end of the probe wears by contact with the wafers. The coplanar type radio frequency probe is also disadvantageous in that an impedance matching circuit cannot be formed therein. Due to the failure in impedance matching between the measuring apparatus and the semiconductor device, an RF power input into the semiconductor device is largely reflected by the semiconductor device. As a result, correct measurement is not possible.

The radio frequency probe for digital signals can transmit a digital signal of several tens of MHz. However, since a grounding electrode of the radio frequency probe is not in direct contact with a chip, the grounding potential of the chip is different from that of the radio frequency probe. This prevents the transmission of RF power, especially the transmission of an RF power exceeding 1 GHz because of the large variation in impedance.

For the above reasons, a radio frequency probe has not been developed which can measure the analog RF characteristics of a semiconductor device on a wafer.

Conventionally, when a semiconductor device is packaged and used as an electronic component, the semiconductor device is tested according to a procedure as shown in FIG. 8. First, semiconductor devices formed on a substrate is subjected to a DC test (step 101). Only the semiconductor devices having passed the DC test are cut into chips, which are then assembled in a package made of ceramic and the like (step 102). The packaged semiconductor devices are then subjected to an RF test (step 103). Packages containing the semiconductor devices having passed the RF test are finally mounted on a circuit board as components (step 104). According to the above procedure, whether or not a semiconductor device is defective is not determined until the semiconductor device has been packaged. This causes an increase in the production cost.

Assume that one wafer includes 1,000 semiconductor devices and that the yields at the DC test and the RF test are both 80%. Then, 160 of the packaged semiconductor devices are thrown away and not used as products due to poor RF characteristics. This means that 160 ceramic packages as well as the time required to package 160 inferior semiconductor devices have been wasted.

SUMMARY OF THE INVENTION

The radio frequency probe of this invention for measuring radio frequency characteristics of a semiconductor device includes: an insulating substrate having a front surface, a back surface, and a side bottom face; a microstrip transmission line including a signal line made of conductive material formed on the front surface of the insulating substrate and a grounding electrode made of conductive material formed on the substantially entire portion of the back surface of the insulating substrate; and a signal needle and a grounding needle electrically connected to the signal line and the grounding electrode, respectively, the signal needle and the grounding needle being close to each other and being disposed so that the distances from the side bottom face to the top ends of the needles are substantially equal to each other so as to allow the signal needle and the grounding needle to contact a signal electrode pad and a grounding electrode pad of the semiconductor device simultaneously.

In one embodiment, the insulating substrate has a shape of the letter L.

In another embodiment, the signal needle is disposed on a side face of an end portion of the L-shaped insulating substrate.

In another embodiment, the radio frequency probe further includes a matching capacitor, wherein the signal line is patterned and provided with the matching capacitor so that the impedance of the microstrip transmission line matches the impedance of the semiconductor device.

Alternatively, a probe card is provided, which includes: a radio frequency probe for measuring radio frequency characteristics of a semiconductor device, the radio frequency probe including: a first insulating substrate including a front surface, a back surface, and a side bottom face; a first microstrip transmission line including a first signal line made of conductive material formed on the front surface of the first insulating substrate and a grounding electrode made of conductive material formed on the substantially entire portion of the back surface of the first insulating substrate; and a signal needle and a grounding needle electrically connected to the signal line and the grounding electrode, respectively, the signal needle and the grounding needle being close to each other and being disposed so that the distances from the side bottom face to the top ends of the needles are substantially equal to each other so as to allow the signal needle and the grounding needle to contact a signal electrode pad and a grounding electrode pad of the semiconductor device simultaneously; a second insulating substrate having a top surface and a bottom surface, a first through hole and a plurality of second through holes disposed at appropriate intervals being formed through the second insulating substrate; a second microstrip transmission line including a second signal line made of conductive material formed on the top surface of the second insulating substrate, a grounding electrode formed on the substantially entire portion of the bottom surface of the second insulating substrate, and a top surface grounding electrode formed on the top surface of the second insulating substrate and connected to the grounding electrode through the plurality of second through holes; and an impedance matching component disposed at least on the first and second microstrip transmission lines, wherein the radio frequency probe is held on the top surface of the second insulating substrate so as to be substantially vertical to the second insulating substrate, the first signal line is electrically connected to the second signal line, and the first grounding electrode is electrically connected to the top surface grounding electrode.

Thus, according to the present invention, a radio frequency probe capable of transmitting RF power to a semiconductor device is attained. The input impedance of the semiconductor device can be obtained by S parameters measured by adjusting the impedance of a microstrip transmission line to 50 ohms.

Further, according to the present invention, the impedance matching between a semiconductor device and a signal source connected to an input of the semiconductor device or a power sensor connected to an output of the semiconductor device can be achieved. Thus, a probe card capable of measuring the RF characteristics of a semiconductor device on a wafer is attained.

Thus, the invention described herein makes possible the advantages of (1) providing a radio frequency probe capable of transmitting an RF power to a semiconductor device, and (2) providing a probe card including the radio frequency probe where an impedance matching circuit can be formed and the RF characteristics of a semiconductor device on a wafer can be measured.

These and other advantages of the present invention will become apparent to those skilled in the art upon reading and understanding the following detailed description with reference to the accompanying figures.

BRIEF DESCRIPTION OF THE DRAWINGS

FIGS. 1A, 1B, 1C, and 1D are a front view, a back view, a side view, and a perspective view of a radio frequency probe according to the present invention.

FIGS. 3A and 3B are sectional views of main portions of the probe card of FIG. 2, taken along lines 3A—3A and 3B—3B of FIG. 2, respectively.

DESCRIPTION OF THE PREFERRED EMBODIMENTS

Figure 2:
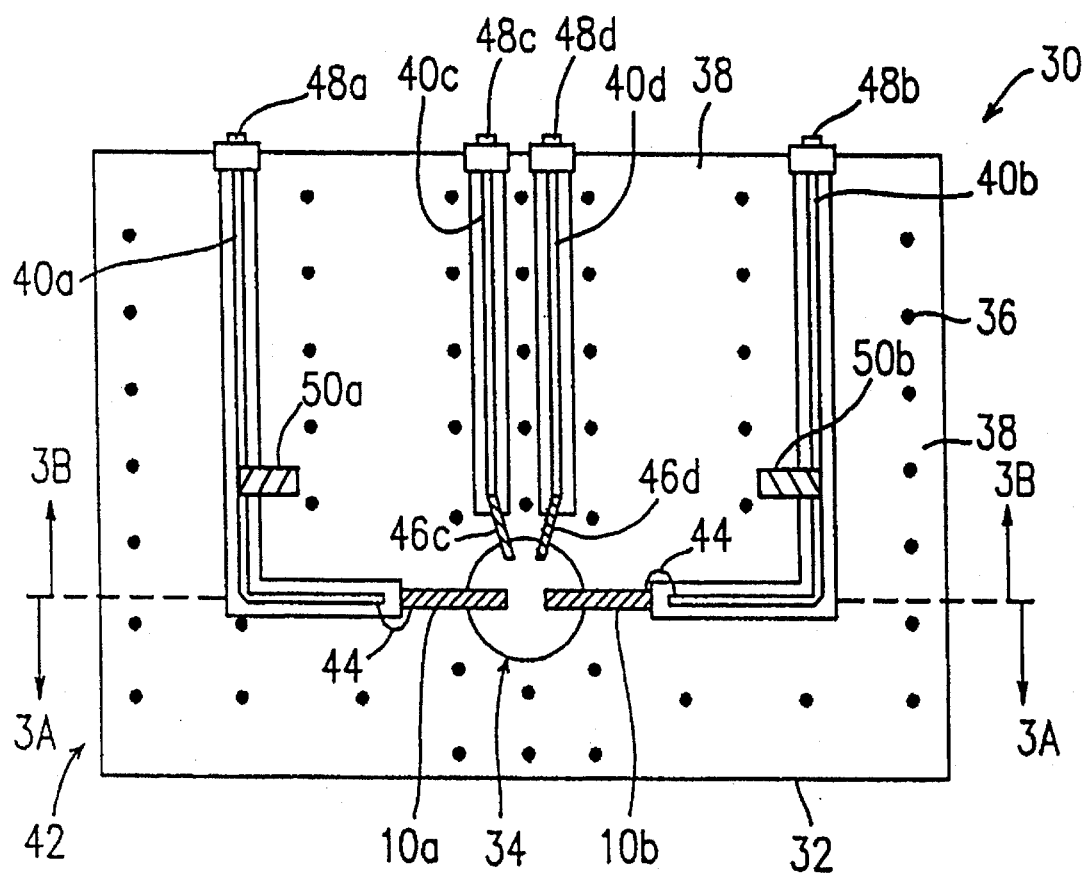
FIG. 2 is a plan view of a probe card according to the present invention.

The present invention will be described by way of example with reference to the accompanying drawings.

FIGS. 1A to 1D are a front view, a back view, a side view, and a perspective view, respectively, of a radio frequency probe 10 of the present invention.

The radio frequency probe 10 includes an insulating substrate 12, a signal line 14 formed on a front surface of the insulating substrate 12, and a grounding electrode 16 formed on the substantially entire portion of a back surface of the insulating substrate 12. The insulating substrate 12 has a shape of letter L, and an end portion 13 protrudes by a length L2 from a side face 24 which is to be a bottom face when the radio frequency probe 10 is attached to a probe card. The insulating substrate 12 may be made of any insulating material such as ceramic and epoxy resin. The signal line 14 and the grounding electrode 16 may be thin films made of any conductive material. A copper thin film is preferable. The signal line 14 and the grounding electrode 16 form a microstrip transmission line.

The radio frequency probe 10 further includes a signal needle 18 and a grounding needle 20. The signal needle 18 and the grounding needle 20, both of which are supported only at one end, are electrically connected to the signal lane 14 and the grounding electrode 16 by soldering or brazing, respectively. The signal needle 18 is secured to a side face 22 of the end portion 13 of the insulating substrate 12, so as to be durable to a weight added at the contact with a wafer as will be described later. A groove 23 is provided at a portion of the grounding electrode 16 adjacent to the side face 22, so as to prevent the signal needle 18 and the grounding electrode 16 from electrically contacting.

As shown in FIGS. 1B and 1D, the top ends of the signal needle 18 end the grounding needle 20 protrude from the side face 22 by a length L1. By this protrusion, when the radio frequency probe 10 is attached to a probe card substantially vertically with the side face 24 contacting the probe card as a bottom face, the signal needle 18 and the grounding needle 20 contact a signal electrode pad 26 and a grounding electrode pad 28 of an object to be measured, respectively, at the same time. Accordingly, when the radio frequency probe 10 is put upside down with the side face 24 being kept horizontal, the top ends of the signal needle 18 and the grounding needle 20 are positioned at the same level of height. The signal needle 18 and the grounding needle 20 are preferably close to each other so that RF power can be transmitted. In practice, in order to transmit an RF power of 2 GHz at maximum, the signal needle 18 is preferably apart from the grounding needle 20 by a distance in the range of 0.1 to 0.5 mm. The same needle that is conventionally used for the DC measurement can be used for the signal needle 18 and the grounding needle 20.

The radio frequency probe 10 can be easily fabricated as follows: A ceramic substrate where the front and back surfaces is covered with copper foil is prepared. The copper foil is patterned so as to obtain the signal line 14 and the grounding electrode 16. Then, the signal needle 18 and the grounding needle 20 are secured to the substrate by soldering or brazing.

According to the radio frequency probe 10, the signal potential and the grounding potential are simultaneously applied to a semiconductor device to be measured at positions close to each other from one radio frequency probe. By this close and simultaneous application, power can be efficiently transmitted. Further, the signal needle 18 and the grounding needle 20 which apply the signal potential and the grounding potential to the semiconductor device, respectively, are both under direct electrical connection with the microstrip transmission line. This makes it possible to form an impedance matching circuit to be provided in the radio frequency probe. Especially, a microstrip transmission line having an impedance of 50 ohms can be obtained in accordance with an internal resistance of the semiconductor device by appropriately patterning the microstrip transmission line and by providing the microstrip transmission line with capacitors. The impedance of the microstrip transmission line may vary by en inductance generated by the signal needle 18 end the grounding needle 20, though the variation is small. When the length L1 from the bent portion to the top end of each of the signal needle 18 end the grounding needle 20 is in the range of approximately 2–5 mm, a power of 2 GHz at maximum can be transmitted. When the calibration of S parameter is conducted at the top ends of the signal needle 18 and the grounding needle 20, an input impedance of the semiconductor device can also be measured by connecting the radio frequency probe 10 with a measuring apparatus, such as a network analyzer, capable of measuring an impedance.

The signal line 14 may be formed on the back surface of the radio frequency probe 10 while the grounding electrode 16 being formed on the front surface thereof. The pattern of the signal line 14 may be changed depending on the internal resistance and the measured frequency of an object to be measured.

Next, a probe card 30 using the radio frequency probe 10 will be described.

FIG. 2 is a plan view of the probe card 30 for measuring a field effect transistor for RF. FIGS. 3A and 3B are sectional views of main portions of the probe card 30. The probe card 30 includes an insulating substrate 32 having a through hole 34 for measurement and a plurality of through holes 36 disposed at appropriate intervals. On a top surface of the insulating substrate 32 are formed a surface grounding electrode 38 and signal lines 40a, 40b, 40c, and 40d, all of which are made of conductive thin films. A bottom grounding electrode 42 is formed on an entire bottom surface of the insulating substrate 32. The bottom grounding electrode 42 and the surface grounding electrode 38 are electrically connected by way of the through holes 36. The signal lines 40a to 40d, the surface grounding electrode 38, and the bottom grounding electrode 42 form a microstrip transmission line.

As shown in FIGS. 3A and 3B, radio frequency probes 10a and 10b are held on the portion of the surface grounding electrode 38 surrounding the through hole 34. The radio frequency probes 10a and 10b are substantially the same as the radio frequency probe 10 shown in FIGS. 1A to 1D. The radio frequency probes 10a and 10b are used to apply an input signal to and to obtain an output signal from an object to be measured, respectively. Hereinafter, components of the radio frequency probes 10a and 10b for input signals and output signals are denoted by adding "a" and "b", respectively, to the reference numerals for the corresponding components of the radio frequency probe 10.

In the radio frequency probe 10a, a side face 24a of an insulating substrate 12a lies on the surface grounding electrode 38. A grounding electrode 16a and the surface grounding electrode 38 are secured to each other by soldering so that the insulating substrate 12a is held substantially vertically to the insulating substrate 32 of the probe card 30. The grounding electrode 16a and the surface grounding electrode 38 are thus electrically connected. An end portion 13a of the insulating substrate 12a enters the through hole 34, and a signal needle 18a and a grounding needle 20a are positioned almost in the center of the hole 34. By appropriately adjusting the lengths L1 and L2 so that the body of the probe card 30 can be kept away from a wafer, the top ends of the signal needle 18a and the grounding needle 20a are positioned lower than the bottom surface of the insulating substrate 32.

The radio frequency probe 10b is also held on the surface grounding electrode 38 in the same manner as the radio frequency probe 10a. Signal lines 14a and 14b of the radio frequency probes 10a and 10b are electrically connected to the signal lines 40a and 40b through wirings 44a and 44b, respectively. Better properties as the probe card can be obtained when the wirings 44a and 44b are shorter.

The signal lines 40c and 40d are provided for applying an object with a DC voltage, and are electrically connected to DC probes 46c and 46d which may be conventional probes used for DC measurement. The signal lines 40c and 40d are not necessary when a DC voltage is applied to the signal lines 40a and 40b through a bias T and the like.

The signal lines 40a to 40d are provided with connectors for the connection to a measuring apparatus or a bias source.

Matching capacitors or trimmers as those denoted by reference numerals 50a, 50b, 52a, and 52b may be disposed at appropriate positions on the signal lines 40a to 40d of the insulating substrate 32 and the signal lines 14a and 14b of the insulating substrate 12, as required. One matching capacitor for each signal line As shown in FIGS. 2, 3A, and 3B. However, more than one matching capacitors may be disposed for each signal line.

Figure 4:
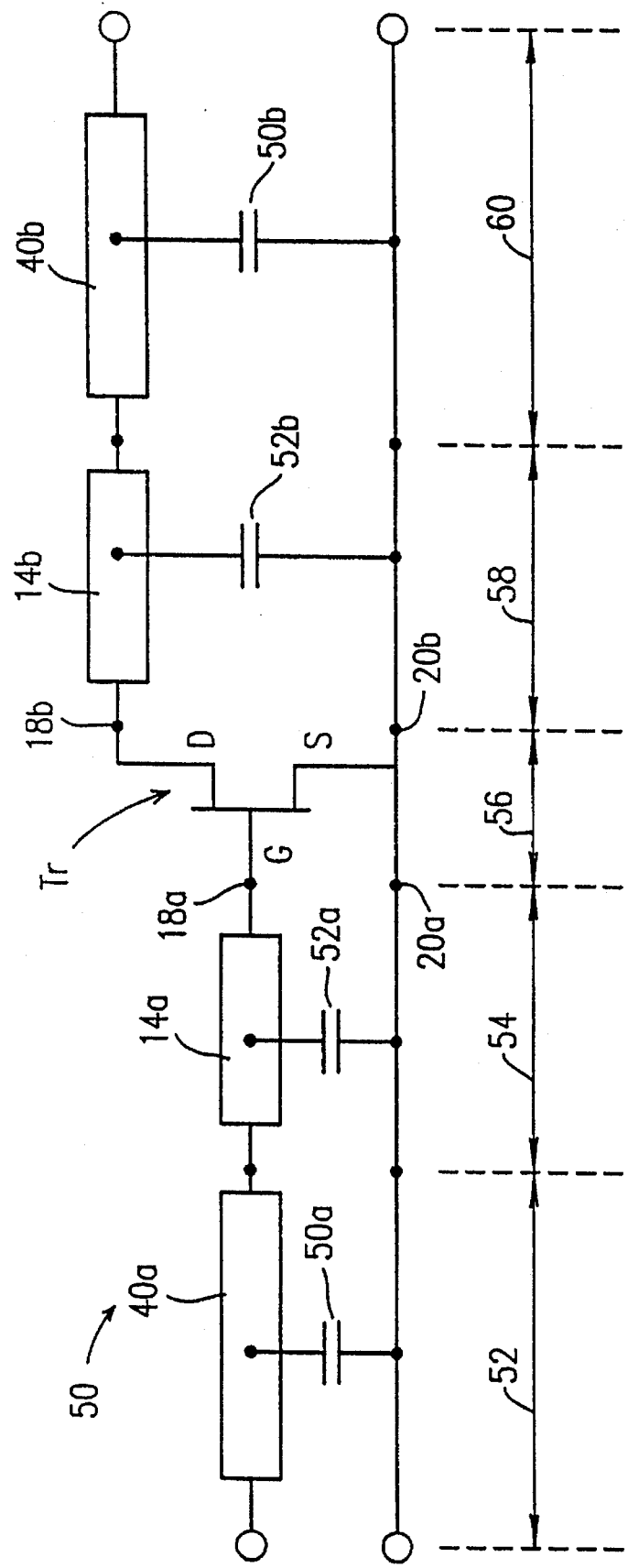
FIG. 4 is an equivalent circuit of a measurement system using the probe card according to the present invention.

FIG. 4 is an equivalent circuit 50 of a measurement system of the probe card 30 of the present invention. In the equivalent circuit 50, circuit portions 52 and 60 correspond to the signal lines, the grounding electrodes, and the matching capacitors formed on the insulating substrate 32 of the probe card 30. Circuit portions 54 and 58 correspond to the signal lines, the grounding electrodes, and the matching capacitors formed on the radio frequency probes 10a and 10b. A circuit portion 56 is an equivalent circuit of a field effect transistor to be measured. As shown in FIG. 4, the signal needle 18a is connected to a gate (G) of a field effect transistor (Tr) to be measured, and the signal needle 18b is connected to a drain (D) thereof. The grounding needles 20a and 20b are connected to a source (S) thereof.

The impedances at the gate and drain of the field effect transistor Tr are greatly influenced by the gate width of the transistor. In general, the impedances at the gate and drain are greatly different from the impedance (50 ohms) of a measuring apparatus. Accordingly, in order to measure the RF characteristics of the transistor, an impedance matching circuit is required for matching the impedance of the measuring apparatus with those at the gate and drain of the transistor. The probe card 30 of the present invention can be provided with an impedance matching circuit since the microstrip transmission line and the matching capacitors are formed in the card body and the radio frequency probes. Moreover, such an impedance matching circuit can be formed close to the gate and drain of the transistor through the signal line adjacent to the grounding needle. This makes it possible to achieve highly efficient power transmission between the impedance matching circuit and the transistor.

The microstrip transmission line including the signal lines 40a, 40b, 14a, and 14b can be processed into a desired shape. Matching capacitor having desired capacitances can be formed at desired positions on the microstrip transmission line. Accordingly, the impedance of the impedance matching circuit can be varied over a broad range, allowing for the probe card to be used for the measurement of various types of transistors. As a result, the RF measurement of transistors on a wafer is possible.

Figure 5:
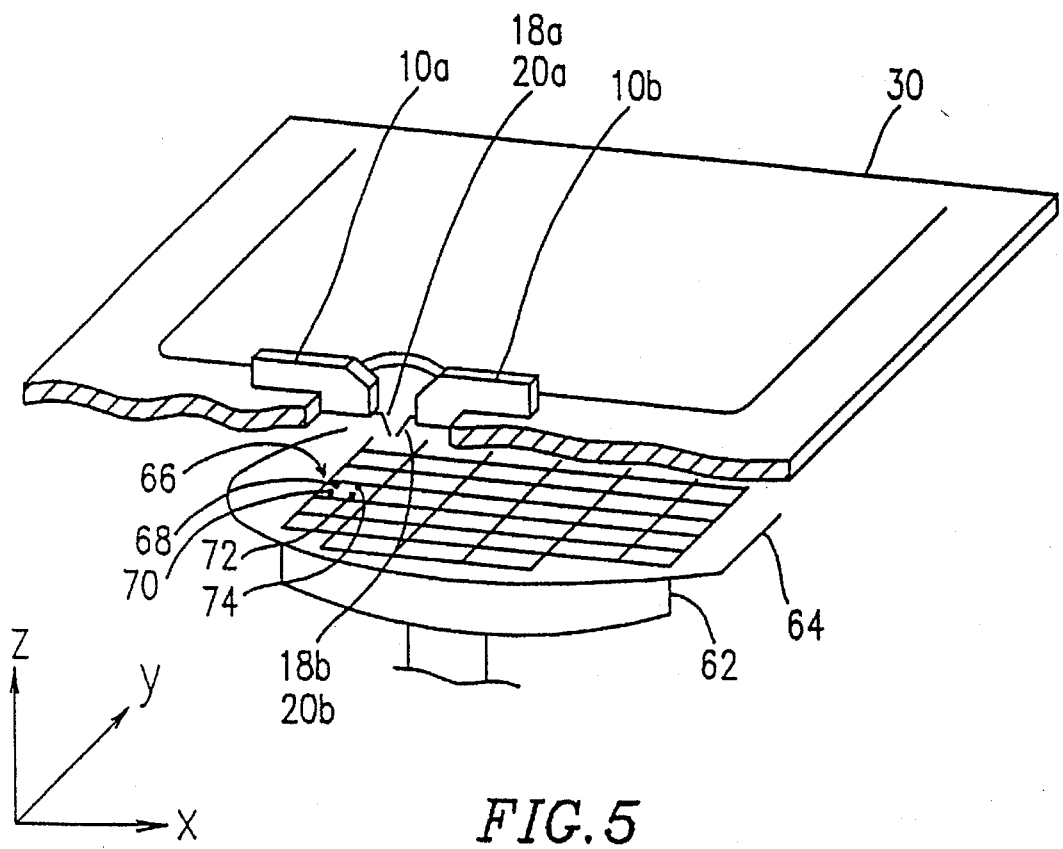
FIG. 5 illustrates a method for conducting an RF test on a semiconductor device on a wafer using the probe card according to the present invention.

The probe card 30 may be mounted on an automatic wafer prober for the measurement or test of the RF characteristics of transistors, as well as the DC measurement. FIG. 5 schematically shows a method for testing transistors on a wafer using the probe card 30. A wafer 64 is chucked under vacuum to a stage 62 of the automatic wafer prober, as is done for the DC measurement. A plurality of transistors 66 are disposed at predetermined intervals on the wafer 64.

The probe card 30 is positioned above the wafer 64. By moving the stage 62 in the z direction, the signal needle 18a and the grounding needle 20a of the radio frequency probe 10a come into contact with a gate pad 70 and a source pad 68 of one of the transistor 66. Similarly, the signal needle 18b and the grounding needle 20b of the radio frequency probe 10b come into contact with a drain pad 74 and a source pad 72. As was described with reference to FIG. 1D, a source electrode is formed adjacent to the gate electrode and drain electrode of the transistor so that the RF characteristics of the transistor can be measured using the radio frequency probe or the probe card of the present invention.

The maximum output, the gain, and the like of the transistor 66 can be measured by applying an input signal of a predetermined RF to the signal needle 18a and obtaining an output signal from the signal needle 18b. Moreover, the DC characteristics can also be measured simultaneously by using a bias T and the like so as to apply the transistor with a DC voltage.

After the completion of the RF measurement and the DC measurement, the stage 62 is lowered in the z direction so as to allow the signal needles and the grounding needles to separate from the respective pads. Then, the stage 62 is moved in the x and y directions, and the same procedure is repeated for the measurement of an adjacent transistor.

Figure 6:
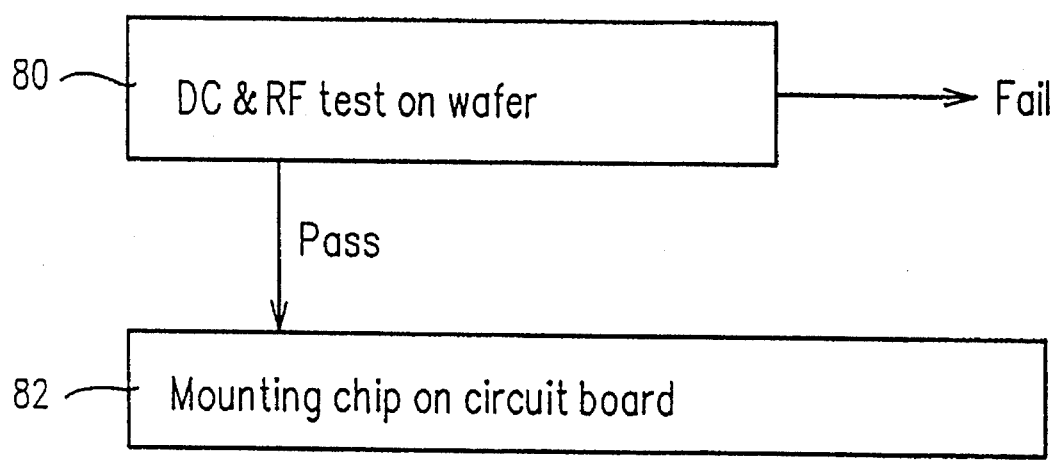
FIG. 6 is a flow chart of an assembly process of a semiconductor device when using the probe card according to the present invention.

Thus, the RF characteristics of semiconductor devices on a wafer can be measured by using the radio frequency probe and the probe card of the present invention. As shown in FIG. 6, the DC test and the RF test are conducted simultaneously for semiconductor devices on a wafer (step 80). Then, only the devices having passed both the DC test and the RF test are mounted on a circuit board as chips (step 82).

According to the present invention, the packaging of a semiconductor chip is not necessary. This reduces the number of manufacture steps, improves the final yield, and shortens the assembly process. Conventionally, when the RF test is conducted for a semiconductor device assembled in a package, it is required to put each package on a measuring apparatus one by one for the test. According to the present invention, however, the RF test can be conducted for semiconductor devices on a wafer automatically and simultaneously. This greatly reduces the time required for the test.

Moreover, since an impedance matching circuit can be formed by disposing a microstrip transmission line and matching capacitors in the radio frequency probe and the probe card, the RF test can be conducted under conditions similar to the actual operating conditions. A desired impedance matching circuit can be formed corresponding to the internal impedance of an object to be measured. In general, the positions of the needles of the probe card are designed corresponding to the positions and shapes of pads of semiconductor devices to be measured. This requires preparing a probe card for each type of semiconductor device. Accordingly, an impedance matching circuit corresponding to the internal resistance of a semiconductor device to be measured may be formed when a probe card with desired needles is prepared.

In the above example, the probe card for measuring a field effect transistor was described. However, it would be understood that the probe card of the present invention can also be used for the measurement of other semiconductor devices. The probe card may include two or more radio frequency probes depending on an object to be measured. Especially, the radio frequency probe of the present invention is disposed so that the insulating substrate on which the microstrip transmission line is formed is held vertical to the substrate of probe card. Accordingly, it is possible to dispose a plurality of radio frequency probes close to one another on the probe card.

Figure 7:
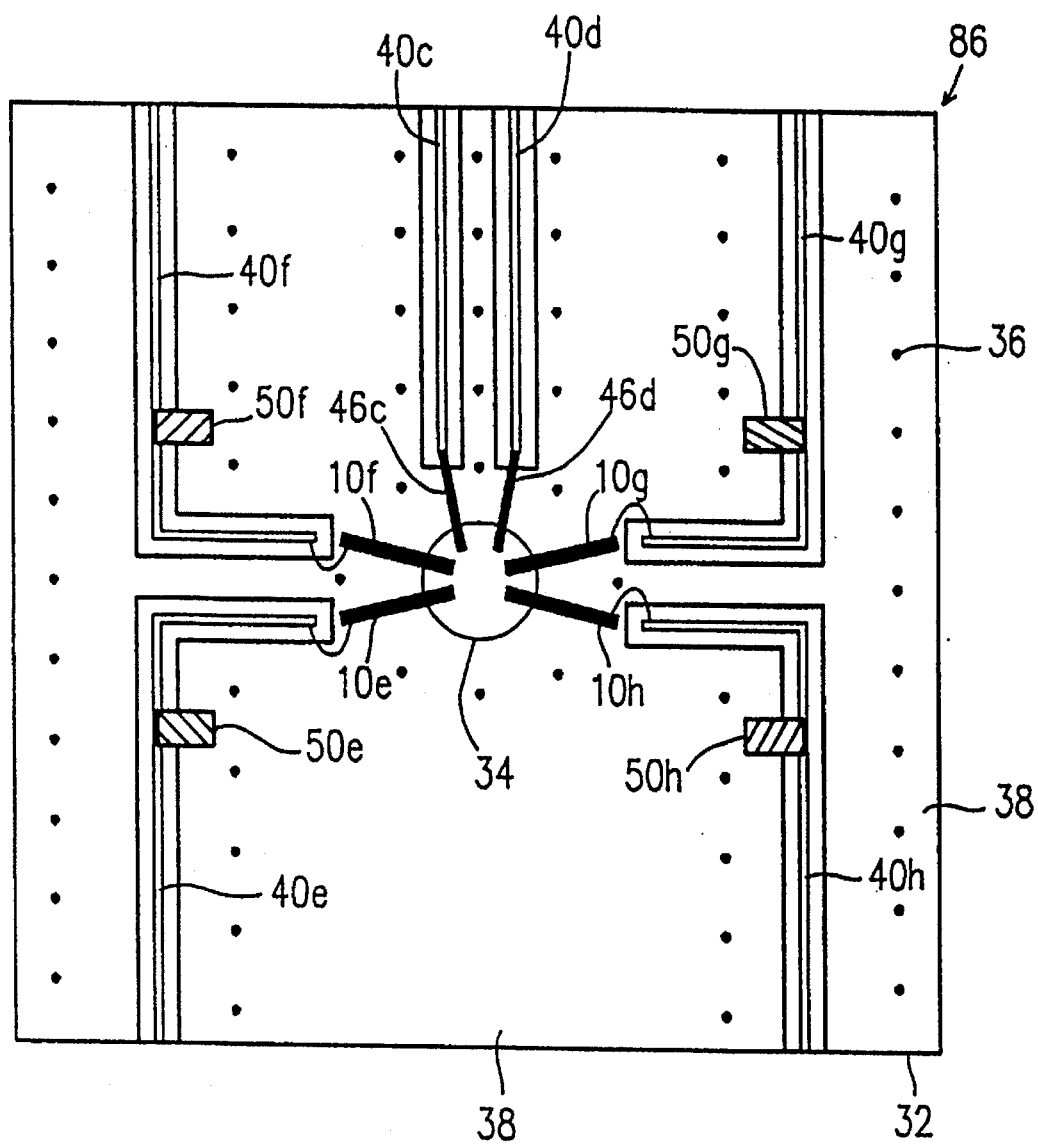
FIG. 7 is a plan view of another probe card having four radio frequency probes according to the present invention.
Figure 8:
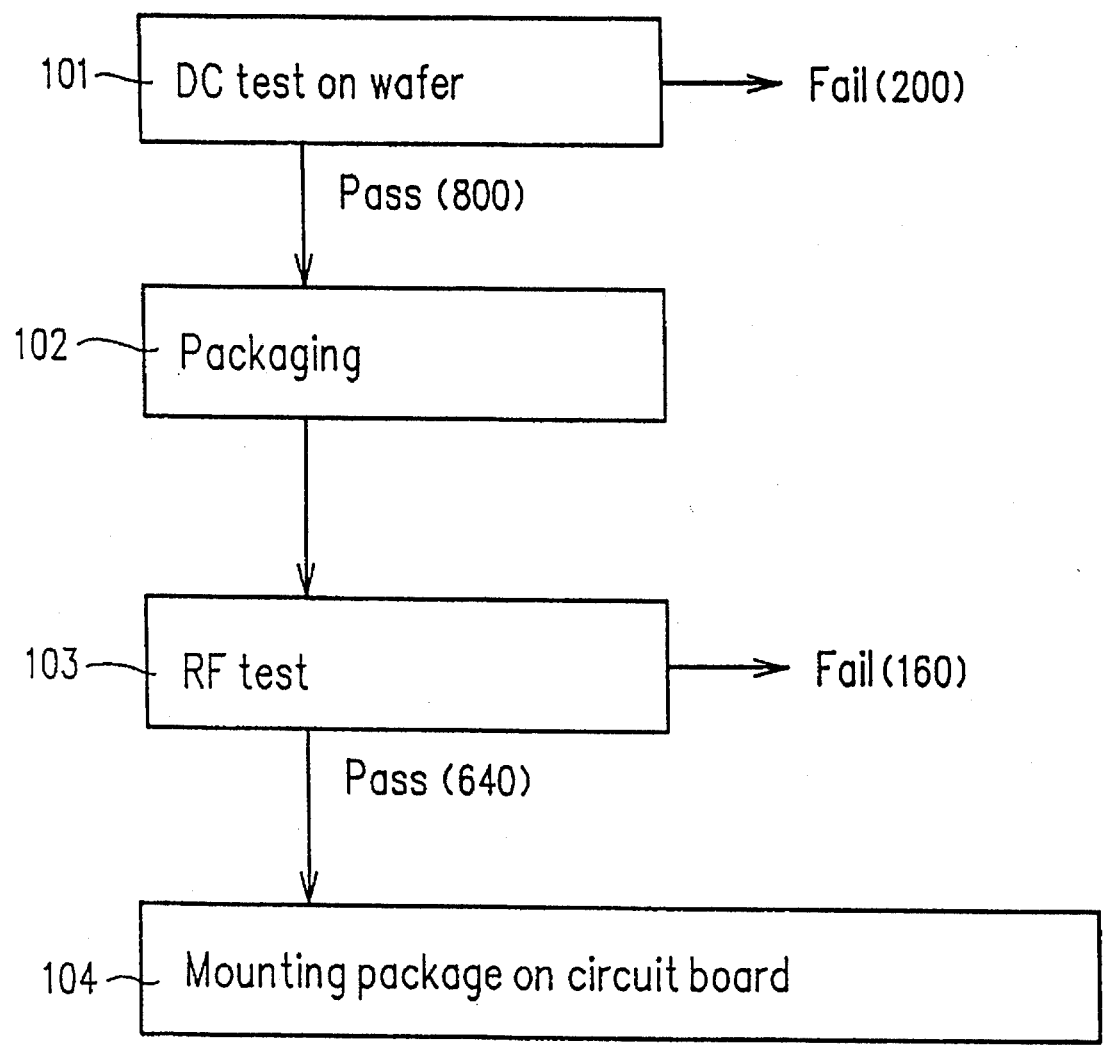
FIG. 8 is a flow chart of an assembly process of a semiconductor device when using a conventional probe card.

For example, as shown in FIG. 7, a probe card 86 having four radio frequency probes 10e, 10f, 10g, and 10h will be described. The probe card 86 includes an insulating substrate 32 having a plurality of through holes 36 disposed at appropriate intervals. On a top surface of the insulating substrate 32 are formed a surface grounding electrode 38 and signal lines 40e, 40f, 40g, and 40h all of which are made of conductive thin films. A bottom surface grounding electrode 42 is formed on an entire bottom surface of the insulating substrate 32. The bottom grounding electrode 42 and the surface grounding electrode 38 are electrically connected by means of the through holes 36. The signal lines 40e to 40h, the surface grounding electrode 38, and the bottom grounding electrode 42 form a microstrip transmission line. The four radio frequency probes 10e, 10f, 10g, and 10h are disposed on the surface grounding electrode 38. Signal lines 40c and 40d are provided for applying an object to be measured with a DC voltage, and are electrically connected to DC probes 46c and 46d. Matching capacitors 50e to 50h are disposed between the signal lines 40e to 40h and the surface grounding electrode 38, respectively.

The radio frequency probes 10e, 10f, 10g, and 10h are held on the surface grounding electrode 38 in the manner as described earlier with respect to FIGS. 3A and 3B.

The probe card having four radio frequency probes may be suitably applied to a mixer which converts an RF signal at two stages. A fundamental RF signal and two local signals are input to the radio frequency probes 10e, 10f, and 10g, and a converted RF signal can be obtained from the radio frequency probe 10h.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A radio frequency probe for measuring radio frequency characteristics of a semiconductor device, the radio frequency probe comprising:

an insulating substrate having a front surface, a back surface, and a side face;

a microstrip transmission line including a signal line made of conductive material formed on the front surface of the insulating substrate and a grounding electrode made of conductive material formed on the substantially entire portion of the back surface of the insulating substrate; and a signal needle and a grounding needle electrically connected to the signal line and the grounding electrode, respectively, the signal needle and the grounding needle being close to each other and being disposed so that the distances from the side face to the top ends of the needles are substantially equal to each other so as to allow the signal needle and the grounding needle to contact a signal electrode pad and a grounding electrode pad of the semiconductor device simultaneously, the signal needle being disposed on the side face of the insulating substrate.

2. A radio frequency probe according to claim 1, wherein the insulating substrate has a shape of letter L.

3. A radio frequency probe according to claim 1, further comprising a matching capacitor, wherein the signal line is patterned and provided with the matching capacitor so that the impedance of the microstrip transmission line matches the impedance of the semiconductor device.

4. A probe card comprising:

a radio frequency probe for measuring radio frequency characteristics of a semiconductor device, the radio frequency probe including:

a first insulating substrate including a front surface, a back surface, and a side face;

a first microstrip transmission line including a first signal line made of conductive material formed on the front surface of the first insulating substrate and a first grounding electrode made of conductive material formed on the substantially entire portion of the back surface of the first insulating substrate; and a signal needle and a grounding needle electrically connected to the first signal line and the first grounding electrode, respectively, the signal needle and the grounding needle being close to each other and being disposed so that the distances from the side face to the top ends of the needles are substantially equal to each other so as to allow the signal needle and the grounding needle to contact a signal electrode pad and a grounding electrode pad of the semiconductor device simultaneously; and the probe card further comprising:

a second insulating substrate having a top surface, a bottom surface, a first through hole, and a plurality of second through holes, the first through hole and the plurality of second through holes being formed through the second insulating substrate;

a second microstrip transmission line including a second signal line made of conductive material formed on the top surface of the second insulating substrate, a second grounding electrode formed on the substantially entire portion of the bottom surface of the second insulating substrate, and a top surface grounding electrode formed on the top surface of the second insulating substrate and connected to the second grounding electrode via the plurality of second through holes; and an impedance matching component disposed at least on the first and second microstrip transmission lines, wherein the radio frequency probe is held on the top surface of the second insulating substrate so as to be substantially vertical to the second insulating substrate, the signal needle and grounding needle extend to contact the semiconductor device through the first through hole, the first signal line is electrically connected to the second signal line, and the first grounding electrode is electrically connected to the top surface grounding electrode.

* * * * *